United States Patent [19]

Ishihara et al.

[11] Patent Number: 4,849,249

[45] Date of Patent: Jul. 18, 1989

[54] DEPOSITED FILM FORMING PROCESS AND DEPOSITED FILM FORMING DEVICE

[75] Inventors: Shunichi Ishihara, Ebina; Yoshiyuki Osada, Atsugi; Shunri Oda, Tokyo; Isamu Shimizu, Yokohama, all of Japan

[73] Assignee: Canon Kabushiki Kaisha, Tokyo, Japan

[21] Appl. No.: 186,770

[22] Filed: Apr. 25, 1988

Related U.S. Application Data

[63] Continuation of Ser. No. 895,700, Aug. 12, 1986, abandoned.

[30] Foreign Application Priority Data

Aug. 15, 1985 [JP] Japan ................................ 60-178648

[51] Int. Cl.$^4$ ...................... B05D 3/06; B05D 5/12; C23C 16/00
[52] U.S. Cl. ........................................ 427/38; 427/34; 427/54.1; 427/53.1; 427/233; 427/234; 118/719; 118/720
[58] Field of Search ................ 118/719, 720; 437/233, 437/234

[56] References Cited

U.S. PATENT DOCUMENTS

| | | |
|---|---|---|
| Re. 31,708 | 10/1984 | Gordon . |
| 2,552,626 | 5/1951 | Fisher et al. . |
| 3,083,550 | 4/1963 | Auerbach . |
| 3,188,230 | 6/1965 | Bakish et al. . |
| 3,203,827 | 8/1965 | Hill . |
| 3,218,204 | 11/1965 | Ruehrwein ......................... 148/175 |
| 3,224,912 | 12/1965 | Ruehrwein ......................... 148/175 |
| 3,306,768 | 2/1967 | Peterson . |
| 3,466,191 | 9/1969 | Stinchfield et al. ................. 117/213 |
| 3,506,556 | 4/1970 | Illery et al. . |
| 3,655,429 | 4/1972 | Deklerk .............................. 117/106 |
| 3,664,866 | 5/1972 | Manasevit .......................... 117/201 |
| 3,850,679 | 11/1974 | Sopko et al. .................... 117/106 R |
| 3,870,558 | 3/1975 | Shimizu et al. .................... 117/201 |
| 3,984,587 | 10/1976 | Lipp . |
| 4,058,430 | 11/1977 | Suntola et al. . |
| 4,096,822 | 6/1978 | Yamawaki et al. .................. 118/48 |
| 4,146,657 | 3/1979 | Gordon . |
| 4,180,596 | 12/1979 | Crowder et al. . |
| 4,206,252 | 6/1980 | Gordon . |
| 4,239,811 | 12/1980 | Kemlage . |
| 4,282,267 | 8/1981 | Kuyel ..................................... 427/38 |
| 4,328,261 | 5/1982 | Heinecke et al. . |
| 4,357,179 | 11/1982 | Adams et al. . |
| 4,359,490 | 11/1982 | Lehrer . |
| 4,402,762 | 9/1983 | John et al. . |
| 4,416,217 | 11/1983 | Nakamura et al. ................. 118/719 |
| 4,422,407 | 12/1983 | Bessot et al. ....................... 118/723 |
| 4,448,801 | 5/1984 | Fukuda et al. . |
| 4,515,107 | 5/1985 | Fournier et al. ................... 118/719 |
| 4,522,663 | 6/1985 | Ovshinsky et al. . |
| 4,526,809 | 7/1985 | Hall et al. ............................ 427/74 |
| 4,529,679 | 7/1985 | Ogawa et al. . |
| 4,554,180 | 11/1985 | Hirooka . |
| 4,595,601 | 6/1986 | Horioka et al. . |
| 4,615,905 | 10/1986 | Ovshinsky . |
| 4,637,938 | 1/1987 | Lee et al. ........................... 427/53.1 |
| 4,650,539 | 3/1987 | Irvine et al. ....................... 156/613 |
| 4,652,463 | 3/1987 | Peters . |

FOREIGN PATENT DOCUMENTS 2038086 7/1980 United Kingdom .

Primary Examiner—Norman Morgenstern
Assistant Examiner—Marianne L. Padgett
Attorney, Agent, or Firm—Fitzpatrick, Cella, Harper & Scinto

[57] ABSTRACT

A process for forming a deposited film according to chemical vapor deposition on a substrate comprises the first step of forming an amorphous film by reacting an excited species (AY) containing an atom (A) which becomes the constituent constituting said deposited film and an atom (Y) with high electronegativity with an active species (Z) which is chemically reactive with said excited species (AY) at a first ratio and the second step of forming a polycrystalline film by reacting said excited species (AY) with said active species (Z) at a second ratio which is different from said first ratio.

12 Claims, 5 Drawing Sheets

DEPOSITED FILM FORMING PROCESS AND DEPOSITED FILM FORMING DEVICE

This application is a continuation of application Ser. No. 895,700 filed Aug. 12, 1986, now abandoned.

BACKGROUND OF THE INVENTION

1. Field of the Invention

This invention relates to a process for forming a functional deposited film useful as functional films, such as thin film transistors (TFT), thin film diodes, phototransistors, photodiodes, or IC and LSI in which these are integrated, or semiconductor devices such as solid state image pick-up devices, light inputting devices, etc., and also devices for such process therefor.

2. Description of related art

For example, a silicon thin film which is one of functional deposited films to be utilized for semiconductor devices, etc., has excellent electric or photoelectric characteristics and a wide scope of applications of promising future use.

Such silicon thin films may be morphological classified broadly into those of polycrystalline phase and those of amorphous phase and are different in various characteristics.

For such silicon thin film, it has been desired and investigated in recent years to establish a technique for separately preparing a silicon thin film of polycrystalline phase and a silicon thin film of amorphous phase on the same substrate. For example, for a photosensor, it is desirable to form a light-receiving section constituting the sensor section at a predetermined position on a substrate with the use of an amorphous silicon thin film having great photosensitivity and a transfer section constituting the signal processing section at a different position above on the substrate with the use of a polycrystalline silicon thin film having great charge mobility.

However, it has been difficult to prepare a silicon thin film of both polycrystalline and amorphous phase at the separate desired positions on the same substrate according to the CVD (Chemical Vapor Deposition) method such as the plasma decomposition CVD method utilizing glow discharging or the thermal CVD method, etc., or the sputtering method, etc.

For example, in the plasma decomposition CVD method, starting gasses of monosilane ($SiH_4$), disilane ($Si_2H_6$) or these gases diluted with $H_2$, Ar, He gas, etc., are used and silicon thin films are formed on a desired substrate by decomposing these gases utilizing glow discharging. For example, in the case of a substrate temperature of 300° C. and discharging power of 0.1 W/cm$^2$, under the conditions of deposition with a volume ratio of 100 to 10% of $SiH_4$ relative to $H_2$, an amorphous silicon thin film is formed. In contrast, under greater glow discharging power and smaller volume ratio of $SiH_4$ to $H_2$, an amorphous silicon thin film containing fine crystalline phase (polycrystalline phase with small grain size) is formed in the film. Such a silicon thin film has excellent doping properties and great charge mobility, but the distribution of the amorphous phase and the microcrystalline phase in the silicon thin film is microscopic in nature, whereby it is impossible to prepare at the same time a silicon thin film of amorphous phase and a silicon thin film of polycrystalline phase by designating regions with desired sizes on a substrate.

As the method for preparing a silicon thin film of amorphous phase and a silicon thin film of polycrystalline phase by sequential plasma decomposition CVD method on a single substrate, it is conceivable to first deposit a polycrystalline silicon thin film on the substrate under appropriate conditions, removing unnecessary portion by means of etching, etc., then depositing an amorphous silicon thin film under appropriate conditions and removing unnecessary portion by means of etching, etc. However, according to this method, the steps are cumbersome and also, it is difficult to effect etching selectively the amorphous silicon thin film and the polycrystalline silicon thin film, whereby there is involved the problem with respect to reliability of the steps.

According to the thermal CVD method, radicals are formed by pyrolysis of a starting material such as monosilane or sisilane, etc., and a silicon thin film is formed by attaching these radicals onto a substrate. Also, in this method, although an amorphous silicon thin film and a polycrystalline silicon thin film can be prepared by selecting appropriate deposition conditions, it is impossible to separately prepare these films at the same time on a single substrate. On the other hand, it has been proposed to irradiate with laser beam or other light beam the whole or a part of an amorphous silicon thin film deposited by the above plasma decomposition CVD method or the thermal CVD method to make such irradiated portion polycrystalline. Although this method has the advantage of making only the minute region selectively polycrystalline by effecting small spot irradiation with a throttled light beam by use of an appropriate optical system, the following problems are involved under the present situation. That is, thermal damages may be caused on the substrate or around the irradiated portion depending on the irradiation conditions, and polycrystalline thin film of good quality cannot be obtained, because it is difficult to make an amorphous silicon thin film containing hydrogen polycrystalline by light irradiation. With respect to the latter problem, the quality of the polycrystalline thin film obtained by light irradiation can improved by suppressing the hydrogen content in the amorphous silicon thin film to a low level, but the film quality of the amorphous silicon thin film will be lowered corresponding to the decreased content of hydrogen. Also in this method, it is difficult to separately prepare an amorphous silicon thin film with good film quality and polycrystalline silicon thin film with good film quality separately on a single substrate. These same problems are also involved with other materials such as germanium or carbon.

SUMMARY OF THE INVENTION

An object of the present invention, in view of the state of the prior art as described above, is to provide a method for forming a deposited film of an amorphous film having good film quality and uniform characteristics and a polycrystalline film having good film quality and uniform characteristic on a single substrate by preparing each separately during the film forming process Another object of the present invention is to provide a process for forming a deposited film comprising the first step of forming an amorphous film by reacting an excited species (AY) containing an atom (A) which becomes the constituent constituting said deposited film and an atom (Y) with high electronegativity with an active species (Z) which is chemically reactive with said excited species (AY) at a first ratio and the second step of forming a polycrystalline film by reacting said excited species (AY) with said active species (Z) at a second ratio which is different from said first ratio.

Still another object of the present invention is to provide a device for forming a deposited film, having two or more reaction chambers for reacting an excited species (AY) containing an atom (A) which becomes the constituent constituting above deposited film and an atom (Y) with high electronegativity with an active species (Z) which is chemically reactive with said excited species (AY).

DETAILED DESCRIPTION OF PREFERRED EMBODIMENTS

Figure 1:
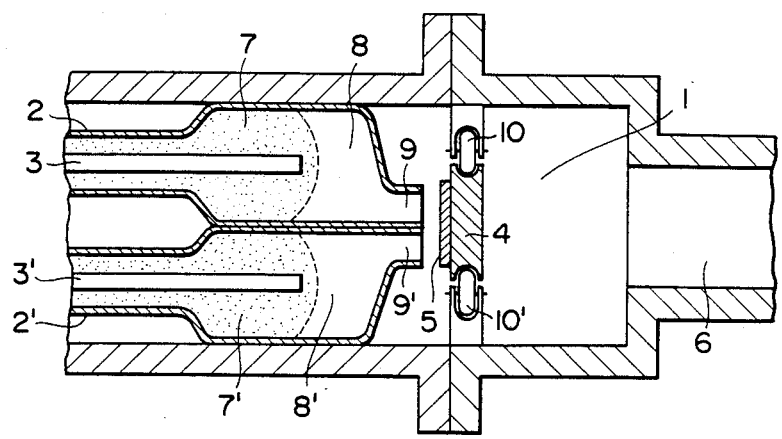
FIG. 1 is a sectional view of a device for forming a deposited film of the present invention.

The substrate to be used in the present invention is not particularly limited in shape, but it can have any desired shape such as plate, cylinder, belt, etc.

The material for the substrate may be electrically insulating or electroconductive.

As the electrically insulating substrate, there may be generally employed a film or sheet of a synthetic resin such as polyester, polyethylene, polycarbonate, cellulose acetate, polypropylene, polyvinyl chloride, polyvinyidene chloride, polystyrene, polyamide, etc., glass, ceramic, paper, and others. These substrates may be subjected to electroconductive treatment by imparting an electroconductive substance onto the surface according to a suitable method.

Examples of electroconductive substrates may include metals such as NiCr, stainless steel, Al, Cr, Mo, Au, Ir, Nb, Ta, V, Ti, Pt, Pd, etc., or alloys thereof. These substrates may be subjected to insulating treatment by imparting an electrically insulating substance onto the surface according to a suitable method.

The atom (A) which is s constituent element constituting the deposited film in the present invention may be exemplified by Si, Ge, C.

The atom (Y) with high electronegativity in the present invention may be exemplified by F, Cl, Br, O, N.

Additionally, the excited species (AY) containing the atom (A), and the atom (Y) in the present invention may include active species, radical species and ion species containing these. Typical examples of excited species (AY) may include the following:

$SiF_2^*$, $GeF_2^*$, $CF_2^*$, $SiBr_2^*$, $GeBr_2^*$, $CBr_2^*$, $SiHF^*$, $GeHF^*$, $CHF^*$, $SiHF_2^*$, $SiH_2F^*$, $SiCl_2^*$, $CO^*$ (Asterisk indicates excited species.)

The starting materials for forming the excited species (AY) may include those having an atom, an atomic group or a polar group with high electron attractivity bonded to the atom (A) which are gaseous or readily gasifiable. Such starting materials may include those represented by the formulae (1) or (2) shown below.

$$A_a H_b X_c \ldots \qquad (1)$$

$$(AH_m X_{2-m})_n \ldots \qquad (2)$$

(wherein A=Si, Ge, C; H is hydrogen atom; X=F, Cl, Br; a=1, 2, 3, 4, 5; $b+c=2(a+1)$; m=0,1; n=3, 4, 5, 6).

Typical examples of the starting materials for forming the excited species (AY) may include: $SiF_4$, $SiFH_3$, $SiF_2H_2$, $SiF_3H$, $GeF_4$, $GeFH_3$, $GeF_2H_2$, $GeF_3H$, $CF_4$, $CFH_3$, $CF_2H_2$, $CF_3H$, $Si_2F_6$, $Si_2F_5H$, $Si_2F_4H_2$, $Si_2F_3H_3$, $Si_2F_2H_4$, $Si_2FH_5$, $Ge_2F_6$, $Ge_2F_5H$, $Ge_2F_4H_2$, $C_2F_6$, $C_2F_5H$, $C_2F_4H_2$, $SiBr_4$, $SiCl_4$, $CBr_4$, $CCl_4$, $Si_3F_8$, $Ge_3F_8$, $C_3F_8$, $Si_2F_3Cl_3$, $Si_2F_3Br_3$, $(SiF_2)_6$, $(SiF_2)_4$, $(SiCl_2)_5$, $(SiBr_2)_5$, $(SiHF)_6$, $(SiF_2)_3$, etc. In addition, $SiH_2(C_6H_5)_2$, $SiH_2(CN)_2$, etc., can be also used depending on the purpose of use of the deposited film to be formed. These can be used either alone or as a mixture if the object can be effectively accomplished.

The energy to be used for forming the excited species (AY) from the starting material may be, for example, light energy, electric energy and heat energy.

As the light energy, there may be included, for example, excimer laser such as rare gas excimer laser ($Xe_2$, $Kr_2$, $Ar_2$), rare gas oxygen excimer laser (XeO, KrO, ArO), mercury halide excimer laser (HgBr, HgCl), rare gas halide excimer laser (XeF, XeCl, KrF, ArF, $Xe_2Cl$, $Kr_2F$), halide excimer laser ($F_2$), etc., those from low pressure mercury lamp (Hg/rare gas), low pressure metal vapor lamp (Cd, Zn/rare gas), high pressure mercury lamp (Hg/rare gas), ultrahigh pressure mercury lamp (Hg/rare gas), Deep-UV lamp (Hg/He), xenon lamp (Xe), rare gas resonance ray lamp (Ar, Kr, Xe), rare gas molecular luminescence lamp ($Ar_2$, $Kr_2$, $Xe_2$), hydrogen lamp ($H_2$, $D_2$), etc. The electric energy may be exemplified by those from respective glow discharge or RF, AC or DC, arc discharge, microwave excitation (2.45 GHz), etc.

The kind and magnitude of these excitation energies may be suitably selected depending on the starting material to be employed etc., to generate the desired excited species (AY).

The active species (Z) in the present invention may include radical species and active ion species. Typical examples of the active species (Z) may include hydrogen radicals, deuterium radicals, nitrogen radicals, hydrogen ions, active hydrogen and active nitrogen.

Specific examples of the starting material for forming active species (Z) may include $H_2$, $D_2$, $N_2$, $SiH_4$, $NH_3$, $Si_2H_6$, etc. These may be used either alone or as a mixture.

The energy to be used for forming the active species (Z) from the starting material may be the same as the energy for forming the above excited species (AY).

In the present invention, formation of a deposited film may be performed by introducing the above excited species and the active species (Z) into a space for film formation in which the substrate is set and carrying out the reaction between these species. As stated previously, the ratio of the above excited species (AY) to the active species (Z) is varied depending on whether an amorphous film is formed or a polycrystalline film is formed. More specifically, the ratio of the active species (Z) to the excited species (AY) in the case of forming an amorphous film (the first ratio) is set greater than the ratio in the case of forming a polycrystalline film (the second ratio). In other words, the second ratio is set so as to be smaller than the first ratio.

The ranges of these ratios may differ depending on the kind of the excited species (AY), the kind of the active species (Z) and further the deposition conditions, etc. For example, the first ratio may be 0.01 to 100 and the second ratio may be 0.001 to 20, with the first ratio being greater than the second ratio.

The conditions during deposition of a film on the substrate may be set suitably depending on the kind of the excited species (AY) and the active species (Z) to be employed. For example, a temperature range from 50° to 350° C. and a pressure range of 10 m Torr or lower may be used.

Also, the thickness of the film to be formed on the substrate is not particularly limited but may be suitably set depending on the use of the film. For example, a thickness in the range from 50 Å to 10 μm may be employed.

In the present invention, during formation of a deposited film, for the purpose of improving film forming speed, film quality, etc., it is preferable to permit active species (G) formed from a gaseous substance having great ionization energy to coexist. Examples of such a gaseous substance may include inert gases comprising elements belonging to the so-called 0 group of the periodic table. Specific examples may include He, Ne, Ar, Kr, Xe, particularly preferably He and Ne.

As the method for forming active species (G), the gaseous starting material for forming active species (G) may be mixed with the starting material for forming the active species (Z) and/or excited species (AY) and the active species (G) may be formed simultaneously with formation of the active species (Z) and/or excited species (AY) in the same space, or alternatively the active species (G) may be formed by permitting activated energy to act on the starting material for formation of the active species (G) in the space separately provided for formation of the activated species (G).

The energy to be used for formation of the active species (G) from the starting material may be the same as the energy for formation of the above excited species (AY).

Thus, the active species (G) are introduced into the film forming space together with active species (Z) and/or the excited species (AY) or through a feeding line separately from these.

In the process of the present invention, electroconductivity and/or electroconduction type of the amorphous film and/or polycrystalline film can be controlled by introducing an atom (CN) belonging to the group III or the group V of the periodic table into the film to be formed. Examples of the atom (CN) to be introduced into the film include B, Al, Ga, In, Tl belonging to the group III of the periodic table and N, P, As, Sb, Bi belonging to the group V. Among them, B, Ga, P and Sb are particularly preferred.

As the starting material for introduction of the atom (CN), gaseous or readily gasifiable substance may be employed. Specific examples may include: $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.

These substances for introduction of the atom (CN) may be introduced into the film forming space together with the excited species (AY) and/or the active species (Z), or alternatively they may be introduced into the film forming space through a feeding line separately from these. Also, these feeding lines may be used in combination. The amounts of these atoms (CN) to be introduced may be adequately set depending on the desired electroconductivity.

In the present invention, the excited species (AY) used in the first step may be the same as or different from the excited species (AY) to be used in the second step. Also, in the present invention, the active species (Z) to be used in the first step may be the same as or different from the active species (Z) to be used in the second step.

The salient feature of the present invention which is markedly different from the prior art resides in the following point. In the case of the prior art, for preparing an amorphous film and a polycrystalline film separately, various deposited films must be prepared by selecting suitably the respective values of a large number of preparation parameters such as the kinds of the starting gases to be employed, gas flow rate, gas flow rate ratio, substrate temperature, pressure, etc. In contrast, in the case of the present invention, by use of the excited species (AY) and the active species (Z) as described above, an amorphous film and a polycrystalline film with desired characteristics can be prepared at the same time on a single substrate by merely varying the mixing ratio thereof which react with each other. Also, in the present invention, by varying the above ratio of the active species (Z) to the excited species (AY), the degree of polycrystallinity of the polycrystalline film such as crystal grain size, uniformity in crystal grain size, etc., as well as electric characteristics or optical characteristics of the polycrystalline film and the amorphous film can be controlled adequately.

Referring now to the drawings, an embodiment of the process for forming the deposited film of the present invention in the case of depositing a silicon film is described in detail.

FIG. 1 is a partial sectional view showing schematic constitution of an embodiment of the device for forming a deposited film for practicing the process of the present invention.

In FIG. 1, 1 is a deposition chamber in which deposition of a silicon thin film is performed internally thereof, and the deposition chamber 1 is internally connected through an exhaust vent 6 to an exhaust system not shown, whereby the deposition chamber can be maintained internally at a desired pressure. In the deposition chamber 1, there are a pair of introducing pipes 3, 3' for radicals containing silicon and halogen which are excited species (AY) and a pair of introducing pipes 2, 2' for hydrogen radicals which are active species (Z) designed so as to enclose said introducing pipes 3, 3' concentrically. The tip portions of the introducing pipes 2, 2' for hydrogen radical are formed to be relatively thick and these portions form the reaction chambers 8, 8'. And, the tip portions of the radical introducing pipes 3, 3' are opened toward said reaction chambers 8, 8'. The tip portions of the reaction chambers 8, 8' are formed to be relatively slender, thus forming the outlets 9, 9'. Internally of the deposition chamber 1, a substrate supporting member 4 is held so as to be reciprocally movable in the direction perpendicular to the paper surface by means of the rollers 10, 10'. And, on said supporting member 4, a substrate 5 for depositing a silicon thin film on its surface is supported and fixed. As shown in the figure, the upper half of the substrate 5 is opposed to the outlet 9 of the reaction chamber 8, while the lower half of said substrate 5 is opposed to the outlet 9' of the other reaction chamber 8'.

In the device shown in FIG. 1, the ratio of the radicals containing silicon and halogen to hydrogen radicals to be mixed in the reaction chamber 8 is different from the ratio of the radicals containing silicon and halogen to hydrogen radicals to be mixed in the reaction chamber 8'. For example, if an amorphous silicon film is to be deposited from the reaction product in the reaction chamber 8, the starting materials are fed into the reaction chamber 8' at a ratio suitable therefor.

The radicals containing silicon and halogen and hydrogen radicals may be formed in the radical forming sections such as heating furnaces or plasma chambers, etc., not shown, respectively, from the respective starting gases, and then introduced into the reaction chambers 8, 8' through the introducing pipes 2, 3 and 2', 3', respectively. Alternatively, the starting gas for hydrogen radicals can be introduced from inside of the introducing pipes 2, 2' and the hydrogen radicals may be formed by glow discharge 7, 7' generated by application of DC voltage or AC voltage between said introducing pipes 2, 2' and the introducing pipes 3, 3'. In the device shown in FIG. 1, when the areas the outlets 9, 9' of the reaction chambers 8, 8' are relatively small and the length of the substrate 5 in the direction perpendicular to the paper surface is relatively long, the substrate can be moved during deposition of the silicon thin film by use of the rollers 10, 10' to deposit a desired silicon thin film on the whole surface of the substrate.

Thus, an amorphous silicon film is formed on the surface of the upper half of the substrate 5, and at the same time on the surface of the lower half of the substrate 5, a polycrystalline silicon film is formed. These films may be further subjected to treatment by etching, etc., to be formed into desired shapes.

The present invention is described in more detail by referring to the following Examples.

EXAMPLE 1

By use of a flat plate glass substrate (#7059 produced by Corning Co.) as the substrate, a silicon thin film was formed on said substrate by means of the device shown in FIG. 1.

By use of $SiF_4$ gas as the starting gas for forming radicals containing silicon and halogen, the gas was permitted to flow into a reaction furnace maintained at 1100° C. to be decomposed therein, and then the reaction products were released through the introducing pipes 3, 3' into the reaction chambers 8, 8'. At the same time, $H_2$ gas was permitted to flow into the introducing pipes 2, 2' with a high frequency of 13.56 MHz and an application power density of 0.02 $W/cm^2$ was applied between said introducing pipes 2, 2' and the introducing pipes 3, 3' to excite glow discharging between said introducing pipe 2 and said introducing pipe 3 and between said introducing pipe 2' and said introducing pipe 3' to effect decomposition, and then the decomposed gases were released into the reaction chambers 8, 8'. The amount ratios of the respective starting materials were, in terms of flow rate ratio, (flow rate of $H_2$ gas into the introducing pipe 2)/(flow rate of decomposed $SiF_4$ gas into the introducing pipe 3)=30SCCM/10SCCM, and (flow rate of $H_2$ gas into the introducing pipe 2')/(flow rate of decomposed $SiF_4$ gas into the introducing pipe 3')=10SCCM/100SCCM. The substrate temperature was maintained at about 250°C.

Figure 2:
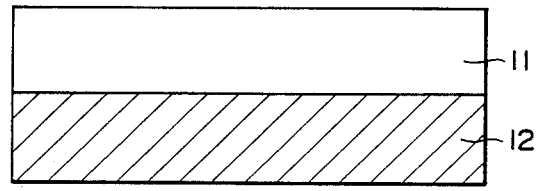
FIG. 2 is a plan view of a substrate having a deposited film formed according to the process of the present invention.

When this state was maintained for 1 hour, it was found that an amorphous silicon thin film was deposited on the upper half 11 of the substrate and a polycrystalline silicon thin film on the lower half 12 of the substrate, as shown in FIG. 2.

The film thicknesses of the respective silicon thin films were found to be 1.0 $\mu$m for the amorphous silicon thin film and 1.2 $\mu$m for the polycrystalline silicon thin film.

From the observation of an electron beam diffraction pattern, the silicon thin film formed on the upper half 11 of the substrate was confirmed to be an amorphous phase Also, the particle size of the polycrystalline silicon thin film as determined by the Scherrar method was about 600 Å.

The electron drift mobility of the amorphous silicon thin film obtained was found to be about 0.8 $cm^2/V \cdot sec$, and the hole mobility of the polycrystalline silicon thin film about 20 $cm^2/V \cdot sec$.

EXAMPLE 2

When a continuously oscillated argon laser beam with a wavelength of 488 nm and an output of 5 W was throttled to a diameter of 1 mm and was irradiated with scanning at a scanning speed of 5 cm/sec onto the region 12, where the polycrystalline silicon thin film was deposited, of the sample obtained in Example 1, the particle size of the polycrystalline silicon thin film was increased to about 1300 Å.

EXAMPLE 3

Figure 3:
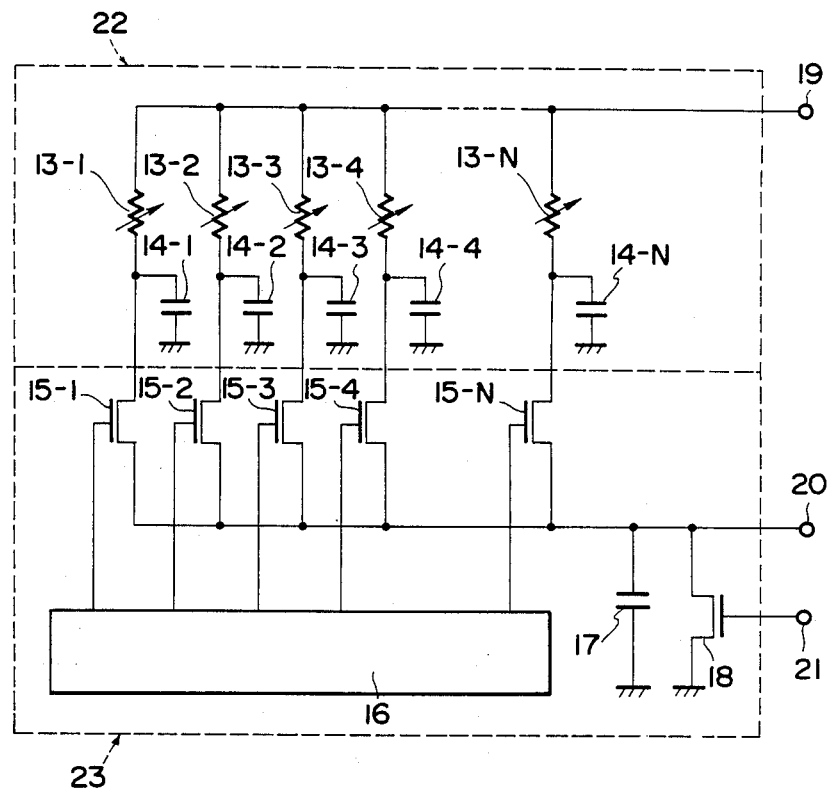
FIG. 3 is a constitutional diagram of a light sensor.
Figure 4:
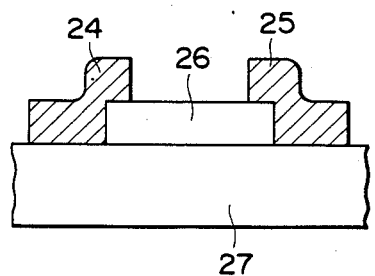
FIG. 4 is a sectional view of a photosensor.
Figure 5:
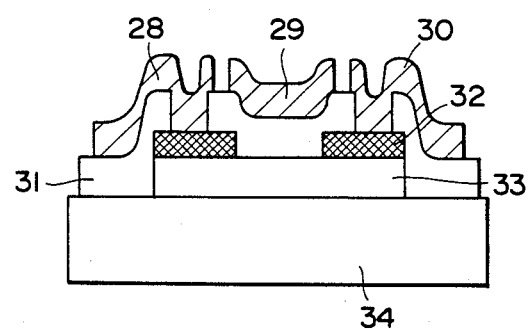
FIG. 5 is a sectional view of a thin film transistor.

By use of the sample obtained similarly as in Example 1, the optical sensor array as shown in FIG. 3 and a signal processing circuit for said sensor array were prepared on the same glass substrate. The silicon thin film at the optical sensor portion 22 was constituted of an amorphous silicon thin film and the silicon thin film at the signal processing portion 23 of a polycrystalline silicon thin film. FIG. 4 shows a sectional view of the optical sensor 13, and FIG. 5 shows a sectional view of an electric field effect type thin film transistor to be used for the transfer gate 15, the shift register 16 and the transistor for discharging 18 of the condenser 17 of the signal processing portion 23. In FIG. 4, 24, 25 are electrodes, 26 is a light receiving portion comprising an amorphous silicon thin film with a film thickness of about 0.5 $\mu$m and 27 is a glass substrate. In FIG. 5, 28, 29 and 30 are source electrode, gate electrode and drain electrode, respectively, of an electric field effect type transistor. 31 is a gate insulating layer comprising a silicon nitride thin film with a film thickness of 0.3 $\mu$m, 32 an n+ layer for obtaining ohmic contact, 33 a semiconductor layer comprising a polycrystalline silicon thin film with a film thickness of 0.6 $\mu$m and 34 a glass substrate.

Next, actuations of the optical sensor array and the signal processing circuit as shown in FIG. 3 are to be explained briefly.

When an appropriate voltage is applied on the terminal 19 and a light corresponding to an information is permitted to be incident on the light receiving portion 13, a current corresponding to the light intensity flows through the amorphous silicon constituting the light receiving portion, resulting in accumulation of charges corresponding to the information in the accumulating condenser 14. Then, by opening successively the transfer gate 15 from 15-1 to 15-N with an appropriate timing, the charges accumulated in the accumulating condensers 14-1 to 14-N move successively to the condenser 17 and are taken out at the output terminal 20 as time series signals. The shift register 16 is a device for opening successively the transfer gate 15.

When the clock of the shift register was actuated at 100 kHz by applying a voltage of 5 V on the terminal 19 and permitting a white light of about 300 lux to be directly incident on the light receiving portion 13, output voltage of 0.8 V could be taken out from the output terminal 20. The output voltage when no light was permitted to enter the light receiving portion 13 was found to be 60 mV.

As shown above, by forming an amorphous silicon thin film having excellent light receiving sensitivity and a polycrystalline silicon thin film with greater mobility of charges as compared with said amorphous silicon thin film on the same substrate and making them respectively into a light receiving portion and signal processing portion separately, an optical sensor excellent in performance and also alleviated in surrounding circuit cost and mounting cost can be obtained.

EXAMPLE 4

Figure 6:
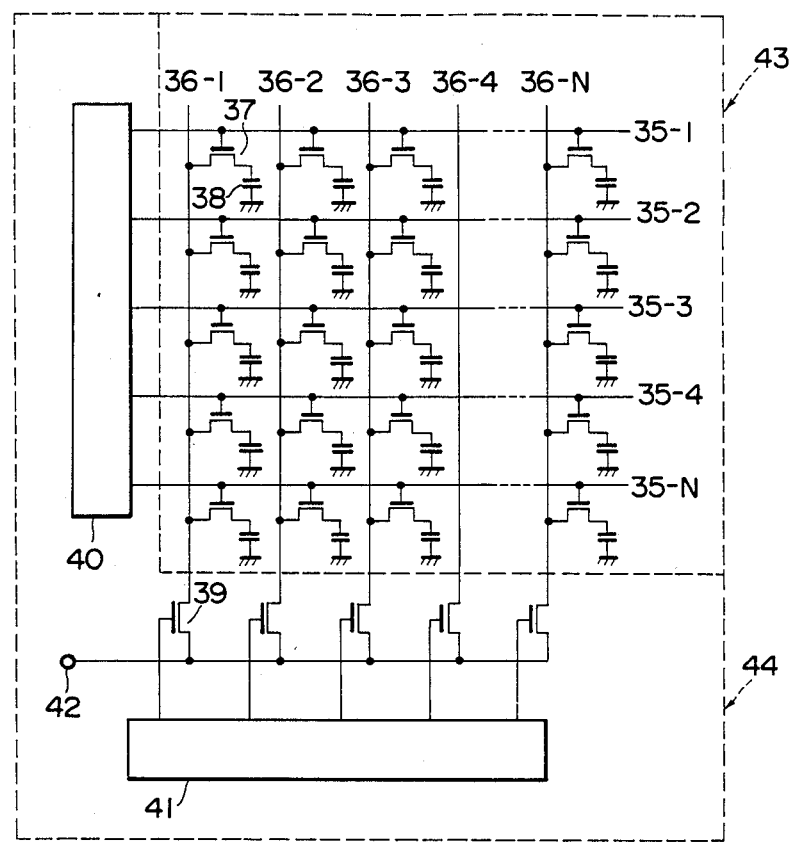
FIG. 6 is constitutional diagram of a matrix panel for liquid crystal display.

Under the same film forming conditions as in Example 1, a matrix panel for liquid crystal display having a driving circuit section 44 and a picture element matrix section 54 provided on the same substrate as shown in FIG. 6 was prepared. The thin film transistor 37 which is a device for switching the picture element matrix section 43 was prepared with the use of an amorphous silicon thin film, and the thin film transistor 39 constituting the driving circuit section 44 with the use of a polycrystalline silicon thin film. Both of said thin film transistors were made to have the constitution as shown in FIG. 5 in order to make the steps commonly utilized. The constituent materials and the film thicknesses of the respective layers are the same as the constitution as described in Example 3 except that the semiconductor layer 33 constituting the thin film transistor 37 of the picture element matrix section 43 comprises an amorphous silicon thin film with a film thickness of about 0.5 μm.

In FIG. 6, 35 shows a gate wire, 36 a source wire, 37 a thin film transistor for switching as mentioned above, 38 a liquid crystal cell, 39 a transistor for distributing the image signals inputted from the image inputting terminal 42 to the respective source wires 36, and 40 a shift register for applying successively gate pulses to the thin film transistor 37 for switching in conformity with the timing of main scanning.

The liquid crystal cell 38 was made a cell of TN mode with a cell film thickness of 8 μm. On the other hand, the display capacity of the picture element matrix portion 43 was made 10000 picture elements of 100 rows×100 columns.

When the channel length of the thin film transistor for switching in the picture element matrix section 43 was made 10 μm and the channel width 20 μm, the on-resistance with a source voltage of 6 V and a gate voltage of 20 V was found to be $2 \times 10^8 \Omega$, and off-resistance when the gate voltage was 0 V was found to be $4 \times 10^{14} \Omega$.

Figure 7:
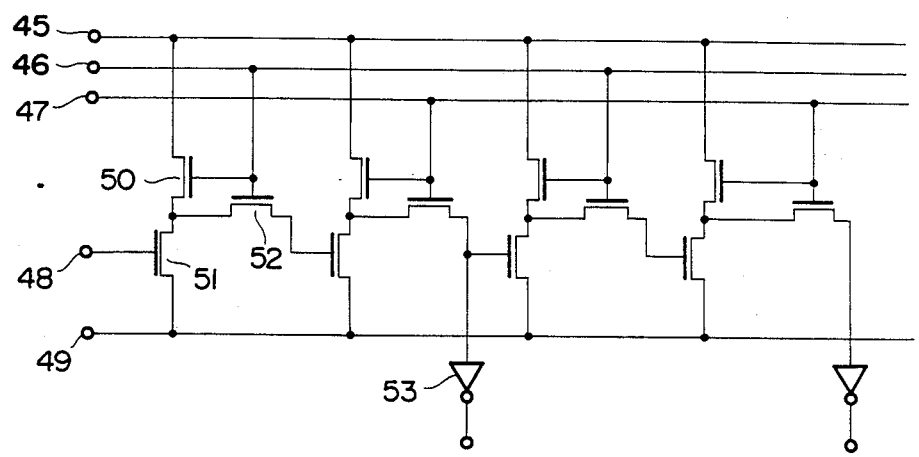
FIG. 7 is an equivalent circuit diagram of a shift register.

FIG. 7 shows a part of the equivalent circuit of the shift registers 40, 41 constituting the driving circuit section 44, 45 showing a power source input terminal, 46 an input terminal of shift clock, 47 an input terminal of the shift clock with the opposite phase to the shift clock inputted at 46, 48 a data input terminal, and 49 an earth terminal. 50 shows a thin film transistor constituting a load transistor, 51 a thin film transistor constituting a driving transistor, 52 a thin film transistor constituting a transfer transistor and 53 an output buffer.

When a power source voltage of 15 V was supplied with the use of a load transistor 50 having a channel length of 10 μm and a channel width of 100 μm and a driving transistor 51 with a channel length of 10 μm and a channel width of 500 μm, the maximum driving frequency was found to be 1.2 MHz.

When the power source voltage was 15 V, clock pulses of about 6 KHz were applied on the shift register 40 and clock pulses of about 0.6 MHz on the shift register 41, with application of pulses of 1/100 duty on both of the data input terminals, and an appropriate image signal was inputted at the image inputting terminal 42. As a result, images with good reproducibility could be obtained at the picture element matrix portion 43.

What is claimed is:

1. A process for forming a deposited film according to chemical vapor deposition on a substrate, comprising the first step of forming an amorphous film by reacting an excited species (AY) containing an atom (A) which becomes the constituent constituting said deposited film and an atom (Y) with high electronegativity with an active species (Z) which is chemically reactive with said excited species (AY) at a first ratio and the second step of forming a polycrystalline film by reacting said excited species (AY) with said active species (Z) at a second ratio which is different from said first ratio.

2. A process for forming a deposited film according to claim 1, wherein the amorphous film is formed on a first portion of said substrate by reacting the excited species (AY) and the active species (Z) at said first ratio in the region in the vicinity of the first portion of the substrate, and at the same time the polycrystalline film is formed on a second portion of said substrate by reacting the excited species (AY) with the active species (Z) at said second ratio in the region in the vicinity of the second portion which is different from said first portion of the above substrate.

3. A process for forming a deposited film according to claim 1, wherein at least a part of the polycrystalline film formed by deposition is selectively irradiated with light.

4. A process for forming a deposited film according to claim 1, wherein said excited species (AY) is selected from those shown below:
 SiF$_2$*, GeF$_2$*, CF$_2$*, SiBr$_2$*, GeBr$_2$*, CBr$_2$*, SiHF*, GeHF*, CHF*, SiHF$_2$*, SiH$_2$F*, SiCl$_2$*, CO*
 (Asterisk indicates excited species.)

5. A process for forming a deposited film according to claim 4, wherein the starting material for forming the excited species (AY) is represented by the following formula (1) or (2):

$$A_a H_b X_c \ldots \quad (1)$$

$$(AH_m X_{2-m})_n \ldots \quad (2)$$

(wherein A=Si, Ge, C; H is hydrogen atoms; X=F, Cl, Br; a=1, 2, 3, 4, 5; b+c=2(a+1); m=0, 1; n=3, 4, 5, 6).

6. A process for forming a deposited film according to claim 5, wherein the starting material represented by the formula (1) or (2) is selected from among those shown below:

$SiF_4$, $SiFH_3$, $SiF_2H_2$, $SiF_3H$, $GeF_4$, $GeFH_3$, $GeF_2H_2$, $GeF_3H$, $CF_4$, $CFH_3$, $CF_2H_2$, $CF_3H$, $Si_2F_6$, $Si_2F_5H$, $Si_2F_4H_2$, $Si_2F_3H_3$, $Si_2F_2H_4$, $Si_2FH_5$, $Ge_2F_6$, $Ge_2F_5H$, $Ge_2F_4H_2$, $C_2F_6$, $C_2F_5H$, $C_2F_4H_2$, $SiBr_4$, $SiCl_4$, $CBr_4$, $CCl_4$, $Si_3F_8$, $Ge_3F_8$, $C_3F_8$, $Si_2F_3Cl_3$, $Si_2F_3Br_3$, $(SiF_2)_6$, $(SiF_2)_4$, $(SiCl_2)_5$, $(SiBr_2)_5$, $(SiHF)_6$, $(SiF_2)_3$, $SiH_2(C_6H_5)_2$, $SiH_2(CN)_2$

7. A process for forming a deposited film according to claim 1, wherein the energy for forming the excited species (AY) is light energy.

8. A process for forming a deposited film according to claim 7, wherein the light energy is laser energy.

9. A device for forming deposited films on a substrate by a chemical vapor deposition process, comprising two or more reaction chambers wherein a reaction occurs between an excited species with an active species; and a substrate supporting member for supporting a substrate said substrate supporting member positioned in a film forming space external to each of said reaction chambers; each of said reaction chambers having an outlet for expelling excited and active species into said film forming space towards said substrate supporting member such that when a substrate is positioned in said supporting member, said outlet of one reaction chamber is opposite and adjacent to one portion of said substrate, and said outlet of another reaction chamber is opposite and adjacent to another portion of said substrate, wherein the deposited films on said one and said another portions of said substrate are formed from the reaction taking place in the reaction chamber of the outlet of each portion.

10. A device for forming a deposited film according to claim 9, wherein said outlet of one reaction chamber is opposite one portion of said surface of said substrate supporting member, and said outlet of another reaction chamber is opposite another portion of said surface of said substrate supporting member.

11. A device for forming a deposited film according to claim 9, wherein the substrate supporting means is movable.

12. A device for forming a deposited film according to claim 9, wherein each reaction chamber has a first tube structure with a second tube structure concentrically positioned therein.

* * * * *

UNITED STATES PATENT AND TRADEMARK OFFICE
CERTIFICATE OF CORRECTION

PATENT NO. : 4,849,249
DATED : July 18, 1989
INVENTOR(S) : SHUNICHI ISHIHARA, ET AL.　　　Page 1 of 2

It is certified that error appears in the above-identified patent and that said Letters Patent is hereby corrected as shown below:

COLUMN 1

Line 16, "therefor" should be deleted.
　　　Line 23, "morphological" should read
　　　　　　　　--morphologically--.
　　　Line 37, "above" should be deleted.
　　　Line 41, "phase" should read --phases--.

COLUMN 2

Line 37, "film" should read --films--.
　　　Line 49, "separately" should be deleted.
　　　Line 61, "process" should read --process.--.

COLUMN 3

Line 59, "may" should be deleted.

COLUMN 7

Line 22, "areas" should read --areas of--.
　　　Line 23, "¶ the" should read --the-- (no ¶).

COLUMN 8

Line 13, "phase" should read --phase.--.

UNITED STATES PATENT AND TRADEMARK OFFICE
CERTIFICATE OF CORRECTION

PATENT NO. : 4,849,249

DATED : July 18, 1989

INVENTOR(S) : SHUNICHI ISHIHARA, ET AL.

It is certified that error appears in the above-identified patent and that said Letters Patent is hereby corrected as shown below:

COLUMN 11

Line 18, "substrate said" should read --substrate, said--.

Line 21, "expelling excited" should read --expelling reacted excited--.

Signed and Sealed this

Twenty-eighth Day of August, 1990

Attest:

HARRY F. MANBECK, JR.

Attesting Officer     Commissioner of Patents and Trademarks